_United States Patent_ [19]

Reymond

[11] Patent Number: 5,366,380

[45] Date of Patent: Nov. 22, 1994

[54] SPRING BIASED TAPERED CONTACT ELEMENTS FOR ELECTRICAL CONNECTORS AND INTEGRATED CIRCUIT PACKAGES

[75] Inventor: Welles K. Reymond, Waterbury, Conn.

[73] Assignee: General DataComm, Inc., Middlebury, Conn.

[21] Appl. No.: 38,175

[22] Filed: Mar. 29, 1993

Related U.S. Application Data

[63] Continuation-in-part of Ser. No. 892,684, May 27, 1992, Pat. No. 5,256,073, and Ser. No. 898,346, May 27, 1992, Pat. No. 5,215,471, which is a continuation of Ser. No. 605,523, Oct. 29, 1990, abandoned, said Ser. No. 892,684, is a continuation of Ser. No. 605,521, Oct. 29, 1990, abandoned, said Ser. No. 605,523, said Ser. No. 605,521, each is a continuation-in-part of Ser. No. 366,546, Jun. 13, 1989, Pat. No. 4,966,556.

[51] Int. Cl.$^5$ .............................................. H01R 9/09
[52] U.S. Cl. .................................. 439/66; 361/773; 439/700
[58] Field of Search ...................... 439/68, 70, 71, 66, 439/482, 700, 824, 55, 82, 289, 75; 361/770, 772, 773, 776

[56] References Cited

U.S. PATENT DOCUMENTS

| 3,059,152 | 10/1962 | Khouri | 361/405 |
| 3,144,527 | 8/1964 | Tolegian | 200/51.09 |
| 3,215,968 | 11/1965 | Herrmann | 339/17 |
| 3,290,636 | 12/1966 | Overtveld | 339/17 |
| 3,404,362 | 10/1968 | Amendola | 339/17 |
| 3,407,378 | 10/1968 | Siders et al. | 339/176 |
| 3,447,249 | 6/1969 | Greger | 35/19 |
| 3,504,328 | 3/1970 | Olsson | 339/17 |
| 3,676,776 | 7/1972 | Bauer et al. | 439/482 |

(List continued on next page.)

FOREIGN PATENT DOCUMENTS

| 1406571 | 6/1965 | France | 439/824 |
| 2742716 | 4/1979 | Germany . | |
| 2806683 | 8/1979 | Germany . | |
| 3441480 | 5/1986 | Germany . | |
| 3500227 | 7/1986 | Germany . | |

| 58-165980 | 11/1983 | Japan | 439/82 |
| 61-196170 | 8/1986 | Japan | 439/482 |

OTHER PUBLICATIONS

IBM Technical Disclosure, Ng; vol. 21, No. 7; p. 2707; Dec. 1978.
"Plated Through Hole Contact", IBM Disclosure Bulletin, vol. 6, No. 10, Mar. 1964.
"Pin Pad Contacter", IBM Disclosure Bulletin vol. 17, No. 2, Jul. 1974.
"Controlled Direction Buckling Beams", IBM Disclosure Bulletin, vol. 17, No. 5, Oct. 1974.
"Dual-Level Printed Circuit Board Edge Connector" Research Disclosure, Aug. 1987, No. 280.
Normal Force & Its Measurement, Oct. 1983/85.

_Primary Examiner_—Neil Abrams
_Attorney, Agent, or Firm_—David P. Gordon

[57] ABSTRACT

A contact element for an electrical connector or an integrated circuit which is used with a hold-down mechanism has a base portion, a spring portion having at least partially helical spring elements, and a tapered contact portion which mates in a biased manner with the conductive rim of a hole. The contact element is particularly useful for surface mount applications. The spring portion is preferably arranged with a partially helical spring configuration so that compression of the spring also effects a torsional rotation of the contact portion. The contact element can be fabricated from: a flat sheet with punching, rolling, and/or forming operations, thin walled drawn parts, or modular parts. Additionally, spring sections may be arranged in tandem, in either a co-rotational or counter-rotational manner to provide additional degrees of design freedom with respect to compression range, axial spring rate, and rotational rate. Contact elements can be associated with insulating housings and/or spacers which provide functions such as alignment, compression limitation, contact support, and installation fixturing. In a preferred embodiment the contact portion has a non-linear taper which permits the normal mating force to be well defined regardless of the diameter of the conductive rim of the hole.

46 Claims, 8 Drawing Sheets

U.S. PATENT DOCUMENTS

| | | | |
|---|---|---|---|
| 3,747,045 | 7/1973 | Stross | 339/17 C |
| 3,783,433 | 1/1974 | Kurtz et al. | 339/17 C |
| 3,810,258 | 5/1974 | Mathhauser | 339/12 R |
| 3,885,215 | 5/1975 | Weinstock | 324/158 P |
| 3,899,231 | 8/1975 | Bray | 339/17 LC |
| 3,996,516 | 12/1976 | Luther | 324/158 F |
| 4,004,298 | 1/1977 | Freed | 3/1 |
| 4,009,921 | 3/1977 | Narozny | 339/99 |
| 4,012,093 | 3/1977 | Crane | 339/17 F |
| 4,037,899 | 7/1977 | Crowell | 339/17 C |
| 4,042,880 | 8/1977 | Weinstock | 324/64 |
| 4,095,867 | 6/1978 | Parks | 339/92 M |
| 4,118,090 | 10/1978 | Del Mei | 339/12 R |
| 4,164,704 | 8/1979 | Kato et al. | 324/73 PC |
| 4,175,810 | 11/1979 | Holt et al. | 339/17 C |
| 4,242,657 | 12/1980 | Chaillot | 335/207 |
| 4,245,189 | 1/1981 | Wahl et al. | 324/65 P |
| 4,246,627 | 1/1981 | Poensgen | 361/773 |
| 4,270,826 | 6/1981 | Narozny | 339/75 MF |
| 4,307,928 | 12/1981 | Petlock, Jr. | 439/824 |
| 4,321,532 | 3/1982 | Luna | 324/158 F |
| 4,381,134 | 4/1983 | Anselmo et al. | 339/220 R |
| 4,417,095 | 11/1983 | Beun | 174/52 FP |
| 4,428,640 | 1/1984 | Pittman | 339/176 M |
| 4,443,756 | 4/1984 | Lightbody | 324/73 PC |
| 4,448,466 | 5/1984 | Porter | 339/17 M |
| 4,479,685 | 10/1984 | Kirby | 339/12 R |
| 4,498,722 | 2/1985 | Fedder | 339/75 MP |
| 4,504,101 | 3/1985 | Reimer | 339/17 L |
| 4,508,405 | 4/1985 | Damon et al. | 439/620 |
| 4,510,553 | 4/1985 | Faultersack | 361/413 |
| 4,526,429 | 7/1985 | Kirkman | 339/17 C |
| 4,528,500 | 7/1985 | Lightbody | 324/73 PC |
| 4,533,203 | 8/1985 | Feldman | 339/176 M |
| 4,541,678 | 9/1985 | Lumpp | 339/75 MP |
| 4,548,452 | 10/1985 | Gillett | 339/17 R |
| 4,550,962 | 11/1985 | Czeschka | 339/17 LC |
| 4,571,542 | 2/1986 | Arai | 324/158 P |
| 4,587,596 | 5/1986 | Bunnell | 361/398 |
| 4,606,589 | 8/1986 | Elsbree, Jr. et al. | 339/17 |
| 4,652,066 | 3/1987 | Pelzl | 339/17 LC |
| 4,663,695 | 5/1987 | Ohkawara | 361/405 |
| 4,667,270 | 5/1987 | Yagi | 361/380 |
| 4,675,600 | 6/1987 | Gergin | 324/158 P |
| 4,691,979 | 9/1987 | Manska | 439/82 |
| 4,701,703 | 10/1987 | Malloy | 324/158 F |
| 4,707,655 | 11/1987 | Krüger | 324/158 P |
| 4,717,344 | 1/1988 | Schempp et al. | 439/61 |
| 4,721,908 | 1/1988 | Driller et al. | 324/158 F |
| 4,724,383 | 2/1988 | Hart | 324/158 F |
| 4,730,086 | 3/1988 | Kamijo | 174/74 R |
| 4,735,587 | 4/1988 | Kirayoglu | 439/751 |
| 4,744,764 | 5/1988 | Rubenstein | 439/62 |
| 4,755,149 | 7/1988 | de Jong et al. | 439/248 |
| 4,758,187 | 7/1988 | Guglhor | 439/741 |
| 4,773,877 | 9/1988 | Kruger et al. | 439/844 |
| 4,789,352 | 12/1988 | Kreinberg et al. | 439/260 |
| 4,793,816 | 12/1988 | Pittman et al. | 439/79 |
| 4,793,817 | 12/1988 | Hiesbock | 439/82 |
| 4,795,362 | 1/1989 | Vonder et al. | 439/377 |
| 4,795,977 | 1/1989 | Frost et al. | 324/158 F |
| 4,806,104 | 2/1989 | Cabourne | 439/66 |
| 4,966,556 | 10/1990 | Reymond | 439/80 |
| 5,007,844 | 4/1991 | Mason | 439/68 |
| 5,096,425 | 3/1992 | Takahashi | 439/55 |
| 5,215,471 | 6/1993 | Reymond et al. | 439/66 |

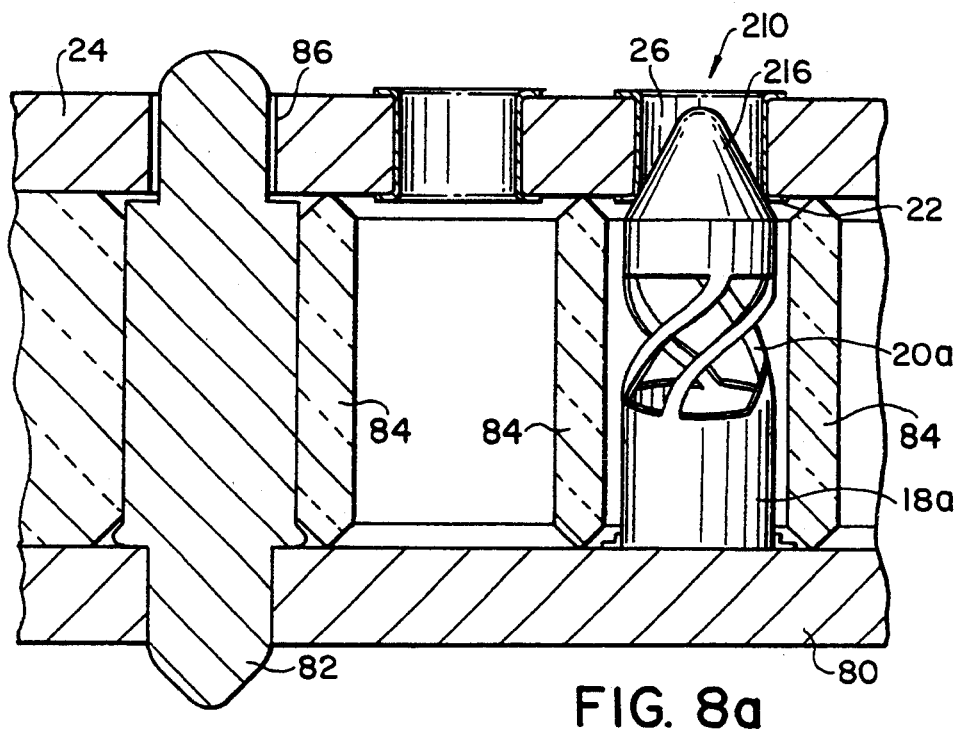
FIG. 8a
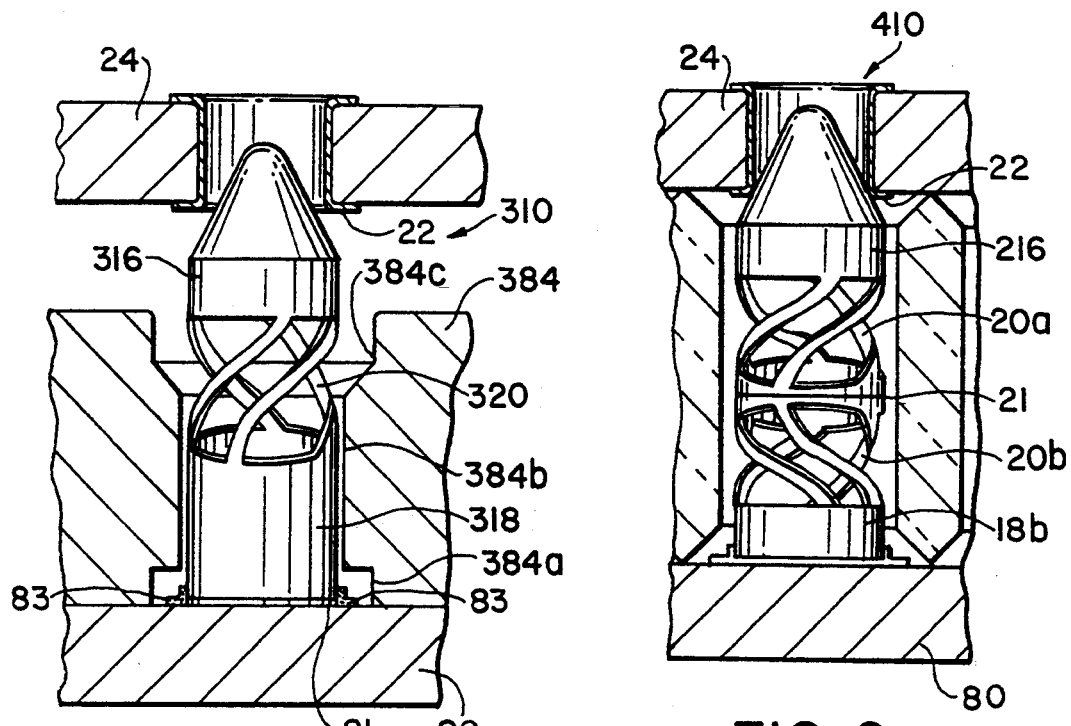
FIG. 8b
FIG. 9

SPRING BIASED TAPERED CONTACT ELEMENTS FOR ELECTRICAL CONNECTORS AND INTEGRATED CIRCUIT PACKAGES

This application is a continuation-in-part of Ser. Nos. 07/892,684 and 07/898,346 both filed May 27, 1992, now U.S. Pat. Nos. 5,256,073 and 5,215,471, respectively, which are hereby incorporated by reference herein in their entireties, and which are respectively continuations of U.S. Ser. Nos. 07/605,521 and 07/605,523 both filed Oct. 29, 1990 and which are both abandoned continuations-in-part of Ser. No. 07/366,546 filed Jun. 13, 1989 which is now issued as U.S. Pat. No. 4,966,556.

This application is related to U.S. Pat. No. 5,160,270 (which issued from application Ser. No. 07/697,201 which was also a continuation-in-part of Ser. Nos. 07/605,521 and 07/605,523) which is also hereby incorporated by reference herein in its entirety.

BACKGROUND OF THE INVENTION

1. Field of the Invention

This invention relates generally to electrical connectors. More particularly, the invention relates to an electrical connector which utilizes the mating of a tapered contact element with the conductive rim of a hole for providing an electrical connector function. The invention further relates to electrically connecting a first board, cable, wire, or other current carrying means which is coupled to the contact element, to a second board, cable, wire or other current carrying means on which the conductive rim of the hole is located. The invention further relates to the electrical connection of integrated circuit packages to circuit boards. More particularly, the invention relates to the packaging of integrated circuits for the removable mounting of the integrated circuits to host boards. The invention has application to all types of integrated circuits.

2. Prior Art

The electrical connector arts are crowded arts with many categories and subcategories of connectors. One such category are connectors which are used to connect two printed circuit boards (PCB). Within that category is a subcategory of connectors where the first PCB is a mother board, and the second PCB is a daughter board at right angles to the mother board, and the connection is a pluggable connection such that replacement of cards and/or expansion of the system is easily accomplished. The standard connectors for permitting such a non-permanent right angle interface require placing a first piece of hardware (e.g. in thee case of conventional inverted DIN type connectors, the pin or male part) on the mother board, and a second piece of hardware the mating female receptacle of a right angle connector) on the daughter board. While such connectors are typically successful for their purpose, as these connectors grow in size with high pin counts, bowing may occur in the connector during mating due to the high insertion force required resulting in difficult mating between the male and female connector shells. Further, these standard connectors are costly as they essentially require the use of two connector parts (a mating pair) for accomplishing a single connection. In fact, systems are often sold with the mother board portion of numerous connectors already attached to the mother board where daughter cards are only to be optionally provided in the event the system is expanded. Thus, where daughter cards are not ultimately used, unnecessary cost is suffered. In any event, it is desirable to provide an arrangement where connectors fixed to a daughter card could make electrical contact with the mother board directly without the added cost of a mating pair.

One solution to such a mother board/daughter board connection is proposed in U.S. Pat. No. 4,533,203 to Feldman et al., where a single connector having pins which are bent through a ninety degree turn and a two piece dielectric housing for housing the same are utilized in conjunction with contact pads on the mother board to establish contact. First ends of the pins are fixed to the daughter card while second ends are disposed at an oblique angle relative to the mother board to provide "wipe" action on the mating surface. Contact with the mother board is made between the angled second ends and contact pads on the mother board and aligning means are provided for aligning the angled pins and the pads. When contact is made, the bent portion of the pins deflects away from the mother board surface, and is permitted to do so by the housing which is enlarged around the area of deflection. With the provided arrangement, the two connector arrangement is obviated.

While the Feldman et al. patent does overcome some of the problems in the art, it does not address several matters of importance. First, the patent does not provide an adequate manner of maintaining the contact between the connector and the mother board, particularly where contact density is high. While a "keying block" is provided to establish alignment and to permit keying, there is no indication that the keying block also provides a means for establishing and maintaining contact. Second, because of the geometric nature of the angled pins and the contact pads, it is very possible that good contact at a sufficient contact force ("normal force") is not established between the pins and the circuit board. Third, where contact density is high, the size of the "engagement" or "hold-in" force (also called "mating" or "insertion" force) necessary for holding down the daughter board so that it may be locked relative to the mother board may very well be prohibitive. This is so, because the Feldman et al. configuration transmits the spring force directly to the contact pad on the mother card without any mechanical advantage. Thus, the "hold-in force" which is equal to the spring force, is also equal to the normal force. Fourth, because of the geometry and nature of the keying block, precise geometries are required, and if not met, may result in malfunctioning of the connector.

Many of the problems of the art are overcome by parent U.S. Pat. No. 4,966,556 which teaches a pluggable electrical connector having contact elements with first ends soldered to a daughter board, mid-sections which are bent through ninety degrees, and second ends which have a converging portion and which terminate in preferably compliant conical contact portions which make contact with the rims of contact-quality plated through holes of a mother board. By causing contact between the rim and the cone surface, normal forces greater than the mating force are generated. The connector housing preferably includes self-centering funnel openings adjacent the mother board for centering the converging portions of the contact elements therein in a nominal position and for acting as a preloading stop. The housing also preferably includes side-wall locking tabs which hold adjacent rows of contacts at identical fixing points relative to the ninety-degree bend to ensure identical spring parameters for all contact elements. By arranging the housing properly, the contact elements can be manufactured into preloaded spring contacts during assembly by bending and locking the first ends of the contacts past the side-wall locking tabs. Cams or retracting bars can be used with rows or individual contacts to create a ZIF connector and/or a selectively engaged pin enabled connector. Magnets, spring-loaded jack screws, or the like are used in conjunction with the connector to establish and maintain force during mating.

Parent Ser. No. 07/898,346 expands on parent U.S. Pat. No. 4,966,556 by providing additional board to board connectors with two contact portions, where both contact portions mate with holes in PCBs. Different embodiments of the springs as well as the contact portions of the the board to board connectors are provided. Additionally, embodiments are provided for tapered contact portion connectors which form a connection between a PCB and a ribbon cable, a flat cable, or a flex circuit. The provided embodiments teach the wide applicability of a connector where mating occurs between a tapered contact element and the rim of a circuit board.

Turning to the integrated circuit package (ICP) portion of the present invention, it is known the ICPs are substantially divided into two main categories: through-hole technology (THT); and surface mount technology (SMT). Examples of three common generic IC packages using the through-hole technology are seen in prior art FIGS. 1a–1c.

In FIG. 1a, a cross-section-through a plastic (N-type) dual-in-line package (DIP) is seen. The N type DIP consists of a circuit mounted on a lead frame having a desired number of leads, where the circuit is encapsulated within an electrically nonconductive plastic compound. The leads of the package of FIG. 1a are formed by stamping a flat sheet of lead material to form a lead frame, and bending the leads of the lead frame appropriately after the integrated circuit has been mounted on the lead frame and encapsulated, so that the leads may be inserted and soldered into mounting-hole rows of a circuit board.

A cross-section through a JD ceramic DIP is shown in FIG. 1b, The JD ceramic DIP has a hermetically sealed ceramic package with a metal cap and with side-brazed tin-plated leads. As with the N dual-in-line package, the leads of the JD ceramic DIP are intended for insertion and soldering into mounting-hole rows of a circuit board.

A partially cutaway top view of a GB pin-grid-array (PGA) ceramic package is seen in FIG. 1c. Like the JD ceramic dual-in-line package of FIG. 1b, the GB pin-grid-array ceramic package is also a ceramic package which is hermetically sealed with a metal cap. However, the "leads" of the GB pin-grid-array ceramic package are typically gold-plated pins which are arranged substantially in squares which surround the hermetically sealed ceramic package. The pins may be inserted and soldered into corresponding mounting holes of a circuit board, or as described in more detail hereinafter, and as is more commonly the case with GB pin-grid array ceramic packages, the package may be inserted into IC sockets which are inserted and soldered into the circuit board.

Examples of three common generic IC packages using the surface mount technology are seen in prior art FIGS. 2a–2c. In FIG. 2a, a perspective view of a D plastic small outline package is seen. The D plastic small outline package is manufactured in similar manner to, and corresponds closely to the N dual-in-line package, as it consists of a circuit mounted on a lead frame and encapsulated within a plastic compound. The only difference is that the free ends of the leads, instead of being straight for insertion into holes, are bent through approximately ninety degrees (i.e. "gull-wing" bent) for surface mounting.

A top view of an HQ quad flat package is seen in FIG. 2b. The HQ quad flat package is similar to the D plastic small outline package of FIG. 2a, except that the circuit is hermetically sealed, and the gull-wing bent leads are located on all four sides of the chip.

Turning to FIG. 2c, a partially sectioned side view of a FN plastic chip carrier package (PLCC package) is seen. As with the D plastic small outline package, the PLCC package consists of a circuit mounted on a lead frame and encapsulated within an electrically nonconductive compound. However, instead of two sets of parallel gull-wing bent leads, the leads are "J" leads which extend around the package in a square configuration. The J leads of the PCC package are surface mount soldered to solder lands.

Common to both the through hole packages and the surface mount packages is that in their basic forms, some kind of soldering process is used to fasten the ICPs to the host board for establishing electrical connection between the IC and the board. From a practical point of view, the soldering is a permanent process.

Although most, if not all, of the surface mount and through hole packages are intended to be soldered into contact with a circuit board, some subsets of the two main categories have been provided with IC sockets. The IC sockets effectively act as an interface or an interlocutor between the ICP and the circuit board. Typically, the IC sockets have contacts having first portions for individually contacting the leads of the ICP, and second portions, which are typically pins, for insertion into and contact with the circuit board. The IC sockets serve various functions, including avoiding the SMT process on a THT board by putting the SMT package in a socket which is soldered into through holes, and providing the ability to replace the IC with a different IC, which is particularly important in updating ROMs.

While IC sockets serve important functions, they have several drawbacks. First, because of their function, the IC sockets introduce an additional physical connection into each circuit. Instead of a single connection where the pins or leads of the ICP contact the circuit board directly, two connections are required; a first connection between the pins or leads and the IC socket, and a second connection between the pins or leads of the socket and the circuit board. This is a drawback, as every additional connection is a potential failure point, and thus system reliability is decreased. Second, the IC sockets are relatively costly. Third, special tools are often required to extract the ICPs from the IC sockets, and the ICPs can be damaged during extraction. A fourth drawback is that the IC sockets cause the ICPs to be lifted relative to the circuit board, thereby limiting the proximity in which two boards or the board and an additional object may be located.

Parent U.S. Pat. No. 5,160,270 overcomes many of the problems of the art by teaching an integrated circuit package with a plurality of contact element leads, each lead having a first portion for making electrical connection with the integrated circuit and a second tapered contact portion for mating with a conductive rim of the hole of a circuit board. In conjunction with the integrated circuit package, a fastener is provided for holding the tapered contact elements in mating relationship with the conductive rims. The tapered contact portion of the lead of the integrated circuit package may take any of various forms, as long as the lead is tapered and resilient so that proper mating with a conductive rim can be accomplished. Likewise, the fastener which holds the tapered contact elements in mating relationship with the conductive rims may take any of numerous forms. All that is required is that the fastener couple to both the circuit board and the integrated circuit package, and that the integrated circuit package be removable from the fastener.

It will be appreciated that the tapered contact elements of the parent U.S. Pat. Nos. 4,966,556 and 5,160,270 resiliently compress as they are pushed into the hole of a printed circuit board. While compressing, the surface of the contact element moves along the rim of the hole as it makes contact providing desired "wipe" and enhanced contact. While the contact forces and wipe provided by the tapered contact elements of the parent applications are suitable for most purposes, it will be appreciated that it is desirable to control many of the parameters which are considered of import in the connector arts. For example, the wipe at the connection, the axial spring rate of the connector, and the inductance of the connector are all considered important parameters, the control of which is desirable.

SUMMARY OF THE INVENTION

It is therefore an object of the invention to provide electrical connectors and integrated circuit packages having tapered contact elements which mate with the conductive rims of holes in the device to which they are being connected, wherein the contact parameters of the connector and IC packages are controlled.

It is a further object of the invention to provide connectors of high wipe for use in connecting one printed circuit board to another.

It is another object of the invention to provide integrated circuit packages having contact elements of high density which mate directly with the conductive rims of holes in a circuit board.

It is yet another object of the invention to provide PGA integrated circuit packages utilizing twisting tapered contact elements which eliminate the need for soldering the integrated circuit to a circuit board, and which do not introduce additional electrical connections, nor the requirement of using complex tools.

It is also an object of the invention to provide an electrical connector having contact elements which are spring biased with a low axial spring rate in a short spring.

Another object of the invention is to provide a spring biased contact element which has a mechanical advantage and which exhibits a strong torque and thus a good wipe as it is axially compressed.

It is still another object of the invention to provide a spring biased contact element which provides low inductance.

Yet a further object of the invention is to provide a spring biased contact element which as one means is easily manufactured from a single sheet of conductive material so that low cost progressive die technology can be utilized.

It is even another object of the invention to provide a spring biased contact element with a tapered contact portion for contacting a conductive rim of a hole where the normal force between the contact portion of the contact element and the rim is magnified as the contact portion is further received into the hole.

In accord with these objects which will be discussed in detail below, the spring biased contact element of the present invention includes a partial helical spring portion from which a conductive tapered contact portion or tip extends. The spring portion is mechanically and electrically coupled to a first device (e.g., an integrated circuit package or a circuit board) while the contact portion mates with a conductive rim of a hole of a second device (e.g., a second circuit board). As the tapered contact portion of the contact element enters the hole and is pressed against the conductive rim of the hole, the spring portion causes the contact portion of the contact element to twist and wipe the conductive rim of the hole. The spring portion also biases the contact portion against the rim to maintain a constant electrical connection.

Preferred aspects of the invention include: forming the tapered contact portion with a circular, parabolic or other non-linear taper; forming the spring portion from flat strips which are each curved to each form partial helical elements; and constructing the contact element by stamping or etching a thin sheet of conductive material and then rolling the material to form a cylinder with a tapered contact portion. Where the contact element is formed by stamping or etching, the "walls" of the contact element include the flat helical spring elements which compresse radially inwardly and causes the contact portion to rotate when the contact element is pressed against the rim of a hole. In accord with different embodiments of the invention, many such contact elements are arranged in a pattern as the contacts of an ICP or as the contacts of an electrical connector coupled to a PCB to mate with conductive rims of holes on another PCB or similar device. The contact elements of the ICP or PCB, once pressed against the conductive rims are held in biased contact by any of several fastening means described in the above-mentioned parents of this application.

The size and shape of the contact elements are such that they can be attached to any device which previously used pins for connection and can be attached to devices using the same techniques used to attach pins to PCBs or ICPs or the like.

Depending on the exact dimensions of the contact element, its compression may be limited by an adjacent spacer so that the springiness is not destroyed. Moreover, as the contact element is free to move somewhat laterally in order to best align with the rim of a hole, one or more rigid alignment pins may be placed in a field of contact elements. Such alignment pins fit within alignment holes when the contact elements align over the conductive rims.

In accord with another embodiment of the invention, the contact element is fitted within a cylindrical member having diameter slightly larger than the contact element and a length somewhat shorter than the contact element. The cylinder acts to limit axial compression of the contact element and also serves to electrically isolate the contact element from nearby contact elements. In addition, by providing a radial wall for the contact element, if the contact element is formed from flat stock, the tube side wall of the contact element need not be brazed, welded, or otherwise fastened when rolled, as the cylinder will act to provide the necessary support.

One of the advantages of the invention is that a very large number of closely spaced contact elements can be connected easily without requiring extreme insertion force and that those same large number of closely spaced contact elements can be disconnected without exerting any pulling force. In this regard, the contact elements according to the invention are typically quite small, often approximately 0.05 inches in diameter and only a few millimeters long. They are advantageously made from a sheet of beryllium copper 0.001 to 0.003 inches thick which is etched or stamped to provide three or more partial helical spring elements between a tapered contact portion and a cylindrical base.

Another important advantage of the invention is that compression of the spring biased contact element effects a torsional rotation of the tapered contact portion which causes the contact portion to strongly wipe a large section of the conductive rim it is contacting. The amount of wipe, as well as the axial spring rate may be desirably controlled by adding a second spring portion in tandem with the first spring portion to the spring contact element.

Additional objects and advantages of the invention will become apparent to those skilled in the art upon reference to he detailed description taken in conjunction with the provided figures.

BRIEF DESCRIPTION OF THE DRAWINGS

FIG. 3c is a plan view of a sheet of beryllium copper showing cut lines for forming the contact element of FIG. 3a;

FIG. 8a is a side view of an additional embodiment of the contact of the invention with portions of a housing and two parallel PCBs shown in cross section;

FIG. 8b is a side view of yet another embodiment of the contact of the invention in conjunction with a portion of an alignment jig and two PCBs shown in cross section; and FIG. 9 is a view similar to FIGS. 8a and 8b, but of yet another embodiment of the invention.

DETAILED DESCRIPTION OF THE PREFERRED EMBODIMENTS

Before describing the preferred embodiments of the invention, it should be appreciated that the contact elements as described herein are for mating with the conductive rims of the holes in an object. The holes need not be round, as connection to rims of other shaped holes (even if the rim is not continuous) is envisioned. Neither must the holes be through holes or plated through holes, as connections with blind holes or holes having only a conductive rim are envisioned. Further, the object in which the holes are located need not be a printed circuit board, as connection to other objects (e.g., flex circuits) is envisioned.

Figure 1A:
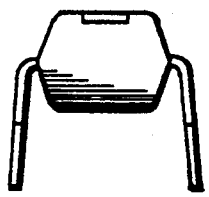
FIG. 1a is a cross-section through a prior art plastic dual-in-line package (DIP) for through-hole technology.
Figure 1B:
FIG. 1b is a cross-section through a prior art JD ceramic: DIP for through-hole technology.
Figure 1C:
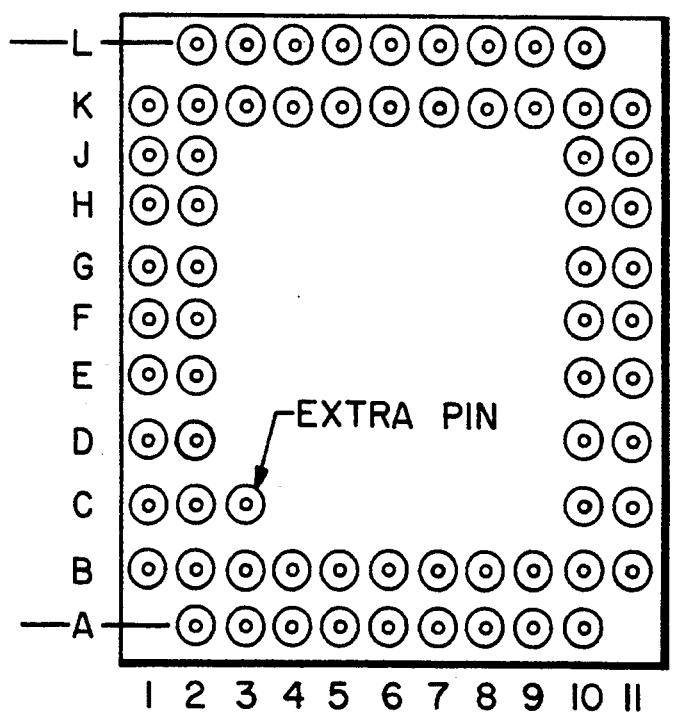
FIG. 1c is a partially cutaway top view of a prior art GB pin-grid-array ceramic package for through-hole technology.
Figure 2A:
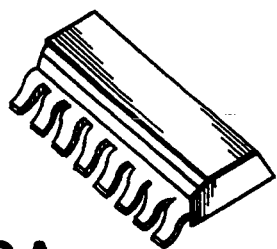
FIG. 2a is a perspective of a prior art D plastic small outline package for surface mount technology
Figure 2C:
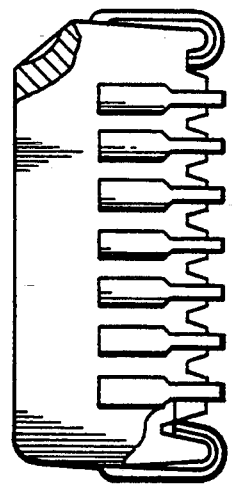
FIG. 2c is a partially sectioned side view of a prior arc FN plastic chip for surface mount technology.
Figure 2B:
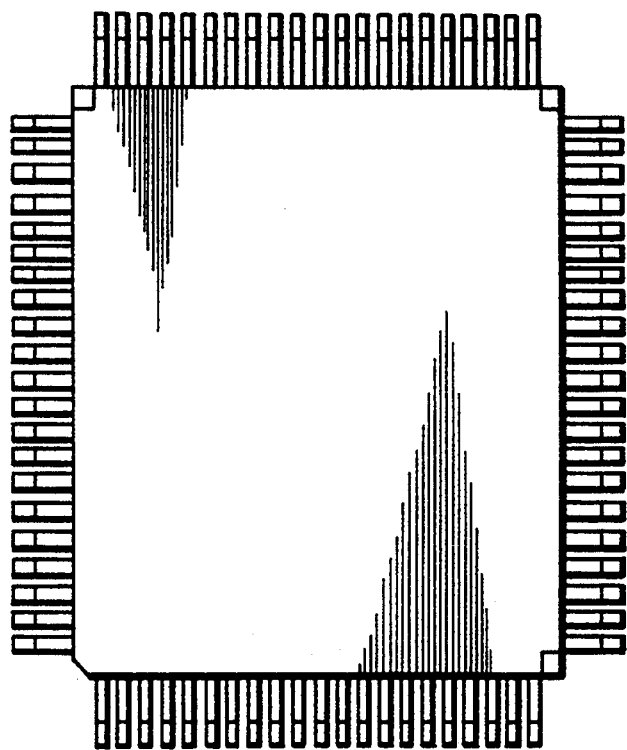
FIG. 2b is a top view of a prior art HQ quad flat package for surface mount technology.
Figure 3A:
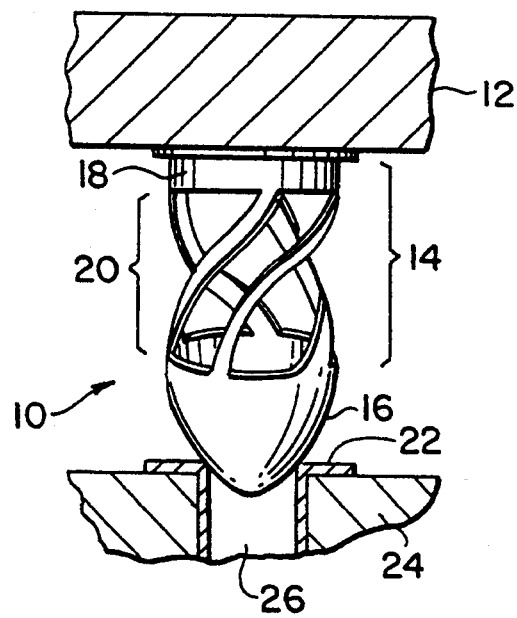
FIG. 3a is a perspective view of a small portion of an ICP carrying a first embodiment of the contact element according to the invention in an uncompressed position.
Figure 3B:
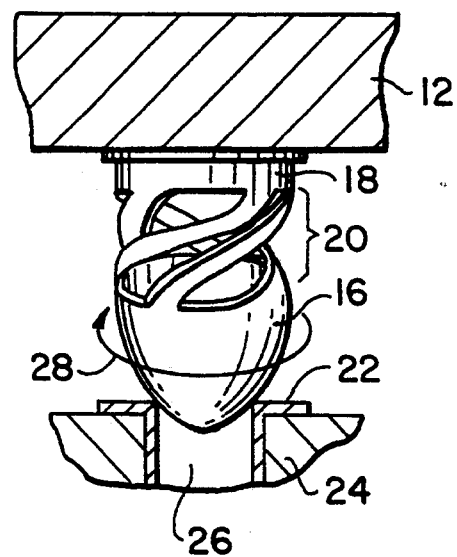
FIG. 3b is a view similar to FIG. 3a showing the contact element in the compressed position.
Figure 3D:
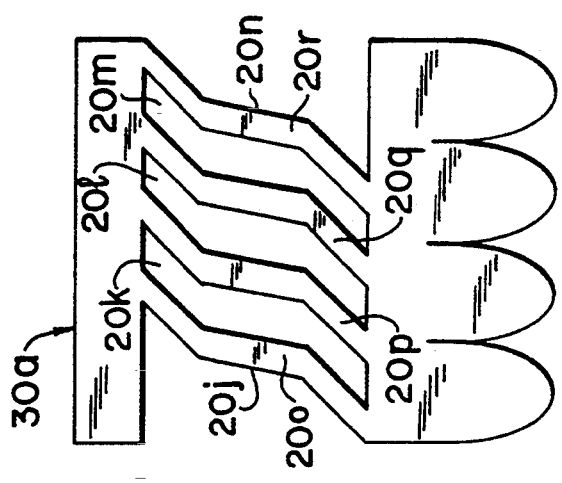
FIG. 3d is a plan view of a sheet of beryllium copper showing cut lines for forming an alternative contact element.
Figure 3C:
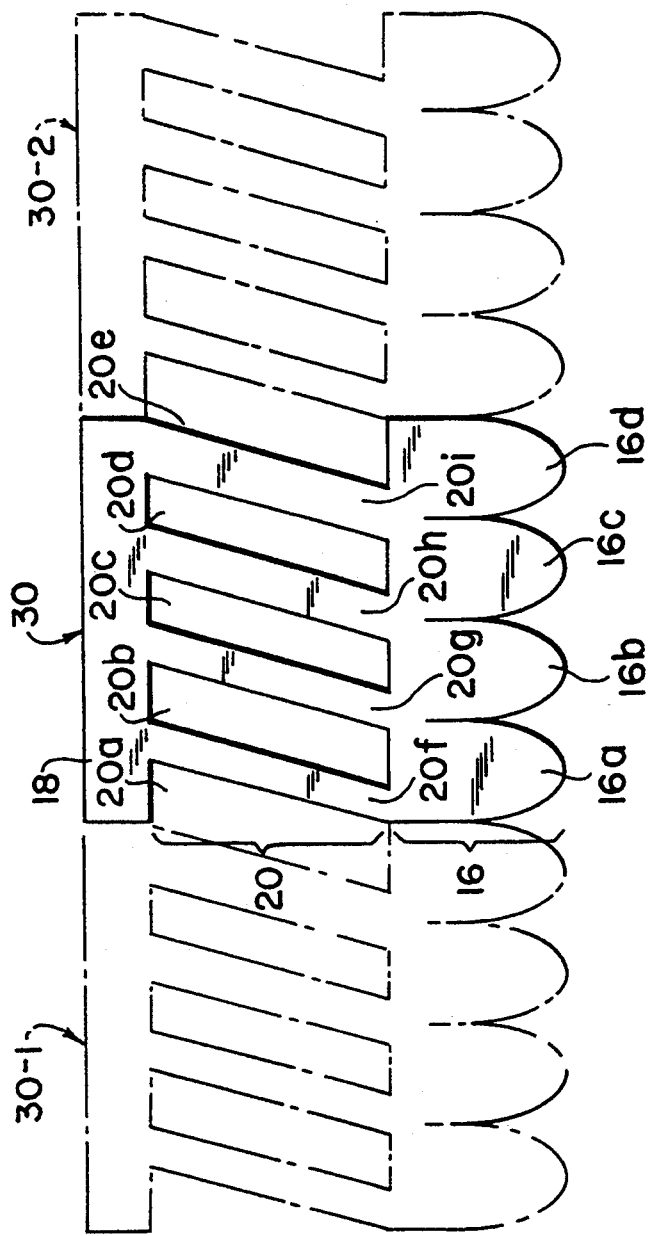

FIGS. 3a through 3c, show a first embodiment of the invention. The contact element 10 is shown in FIGS. 3a and 3b extending from the base of an integrated circuit package 12 such as a PGA. Contact element 10 generally includes a conductive generally cylindrical portion 14 and a conductive tapered contact portion 16. The cylindrical portion 14 generally comprises a base portion 18 and a spring portion 20 with the spring portion preferably having a plurality of partial helical elements. The relative sizes of the respective base, spring and contact portion may vary according to specific applications. Generally, however, the base portion 18 is electrically and mechanically coupled to a portion of a first device (in this case an ICP 12) which requires electrical connection to a second device (e.g., a circuit board), whereas the contact portion 16 makes electrical connection to the second device. In FIGS. 3a and 3b, the second device is a PCB 24 having a hole 26 defined by a conductive rim 22. It will be appreciated that in actual practice, an ICP 12 will have many contact elements 10 extending from its base and PCB 24 will have many holes 26 with conductive rims 22. Those skilled in the art will understand how electrical connection is made between the base portion 18 of the contact element 10 and the internal circuits of ICP 12 and how the conductive rim 22 on PCB 24 is coupled with the circuits of the PCB. In general, however, the coupling of the base portion 18 of the contact element 10 to the ICP 12 is usually accomplished by soldering or brazing to an existing conductive pad on the underside of the ICP 12.

As seen in FIGS. 3a and 3b, it will further be appreciated that when the ICP 12 is pressed against the PCB 24, the spring portion 20 of contact element 10 biases the contact portion 16 against the rim 22 of hole 26 in PCB 24 assuring a good electrical connection between the contact portion 16 and the rim 22. According to a preferred embodiment of the invention, as the spring portion 20 of the contact element is biased (by applying a downward force), a torsional rotation (shown by arrow 28 in FIG. 3b) is effected at the contact portion 16. This rotation of the contact portion 16 causes the contact portion to rotationally wipe the rim 22 as the contact portion extends into the hole and axially wipes the rim, thus ensuring a good electrical coupling. It should be understood by those skilled in the art that any type of spring which effects a rotation during compression can be, used as the spring portion of the contact element to effect the torsional rotation of the contact portion. However, according to a first preferred embodiment of the contact element, the contact portion 16, spring 20 and base 18 are preferably manufactured as an integral piece from a sheet of conductive material as discussed hereinafter with reference to FIGS. 3c and 3d. With the spring elements being formed from flat stock as opposed to round, the spring elements do not act like a classical simple coil spring. Also, by providing a plurality of flat spring elements, parallel electrical paths are provided, thereby reducing inductance as opposed to a single coil spring. Further, by designing the spring elements as desired (e.g., width, thickness, length, twist, etc., the parameters governing contact forces can be controlled. Indeed, depending on the contact environment, more or less wipe may be desired. For example, for nobel metal systems where lots of mating cycles may be required, less wipe may be desirable, whereas in a non-nobel metal environment such as tin or tin-lead, where only a few mating cycles are expected, a large wipe may be desired and tolerated.

Turning now to FIG. 3c, an exemplary embodiment is seen of a flat blank 30 of beryllium copper used to create a contact element 10 shown in FIGS. 3a and 3b. Blank 30 is cut by a die or etched with photo-chemicals and then rolled into a cylinder to provide the base 18, spring 20, and contact portion 16. As shown for example in FIG. 3c, the spring portion 20 is formed by three parallelogrammatical or rhombic holes 20b, 20c, 20d and two angular cuts 20a and 20e. It will be appreciated that when the blank 30 is rolled into a cylinder, cuts 20a and 20e can be connected to form a fourth parallelogrammatical hole and thus define four helical spring elements 20f–20i. Contact portion 16 is formed by four parabolic cuts 16a–16d which form a non-linearly tapered contact portion when the blank is rolled into a cylinder and the parabolic cut portions are pressed or welded together to form the tapered contact portion. As seen in FIG. 3c, the blank 30 may be formed with other contiguous blanks, e.g. 30-1 and 30-2, from a single roll of beryllium copper flat stock rolled in a progressive die to facilitate mass production of the connector.

Turning to FIG. 3d, a second embodiment of a flat bank 30b is shown. As seen in FIG. 3d, holes 20k, 20l, and 20m and angular cuts 20j and 20n take a different form than in FIG. 3c such that the helical spring elements 20o–20r when set out flat have a sine-wave shape. When rolled into a cylinder, the helical spring elements 20o–20r permit additional twisting beyond what might be obtained with the arrangement of FIG. 3c.

It will be appreciated that the blanks 30 and 30b of FIGS. 3c and 3d are but two example of how the contact element 10 may be formed. Different numbers and shapes of cuts and holes may be used, provided a twisting spring arrangement results. For example, it is not necessary that the spring portion consist of four partial helical members, although it is believed that it is preferable to have at least three. Moreover, the contact portion could be formed by a different number of parabolic cuts. In fact, the contact portion need not be formed from the flat stock, as the base, spring, and contact portions may be formed separately and may be connected to each other as will be described below. Also, if desired, the contact portion may be bifurcated as taught in the parent applications hereto or made otherwise resilient and/or laterally tolerant. Regardless, it will be appreciated that the twisting spring arrangement which results provides a good wipe as it mates, and also provides excellent lateral tolerance.

Figure 4:
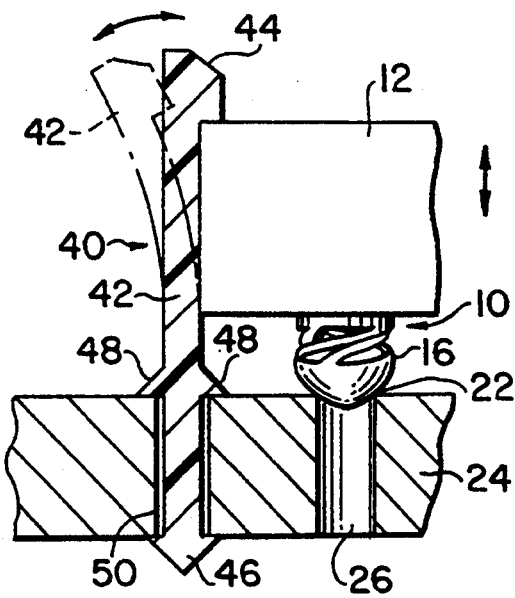
FIG. 4 is a partial cross section showing fastening means for causing an ICP to be fastened to a circuit board.

As will be appreciated, the contact element of the invention requires an outside fastening means to keep the spring portion biased thereby pressing the tapered contact portion against the rim of the hole. FIG. 4 shows one example of a fastening means 40 for fastening an ICP 12 to a PCB 24. Fastening means 40 comprises a resilient plastic post 42 having a holding lip 44 at one end, a barb 46 at the other end, and a protrusion 48 in the middle. The barb 46 is resiliently formed so that it can be forced through hole 50 in the circuit board 24, but cannot be easily removed once forced through. Protrusion 48 is provided as a stop such that the fastening means 40 can be fixed in place prior to the placement of an integrated circuit chip 12 (shown in phantom) onto the PCB 24. Lip 44 is provided to hold down the integrated circuit chip 12. As indicated by the arrows and the phantom movement of post 42, the plastic post 42 of the fastening means 40 is flexible and resilient, and can be bent or pushed out of the way during placement of the integrated circuit chip 12. Once the contact portions 16 of the contact elements 10 of the integrated circuit chip 12 are resting on top of holes 26 of the circuit board (i.e., on the rims 22 of the holes), the chip 12 is preferably pressed down to cause the contact portions of the contact elements 10 to twist into the rims 22, and mate therewith. The plastic post 42 is then released into its unstressed position such that lip 44 of post 42 holds chip 12 in its mating engagement with the PCB 24. Those skilled in the art will appreciate that preferably, at least two fastening means 40 (one on either end of the ICP) are provided to fasten chip 12 to board 24. In disconnecting the chip from mating contact, the plastic posts 42 are bent out of the way, and the chip will typically automatically back out of mating contact and may be physically removed.

Reference is made to the parent applications cited above which disclose other fastening means which may be used with the connector of the present invention.

Figure 5B:
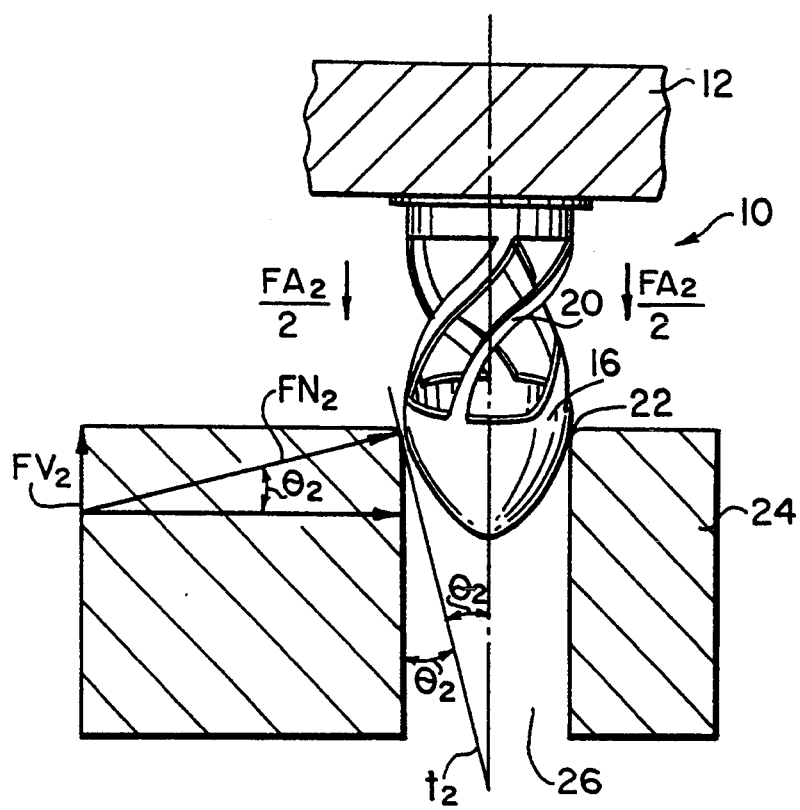
FIGS. 5a and 5b are force diagrams showing both axial insertion (hold-in) and mating contact normal forces against the contact portion of a contact element where the contact portion mates with the rim of a hole at different points along the contact element.
Figure 5A:
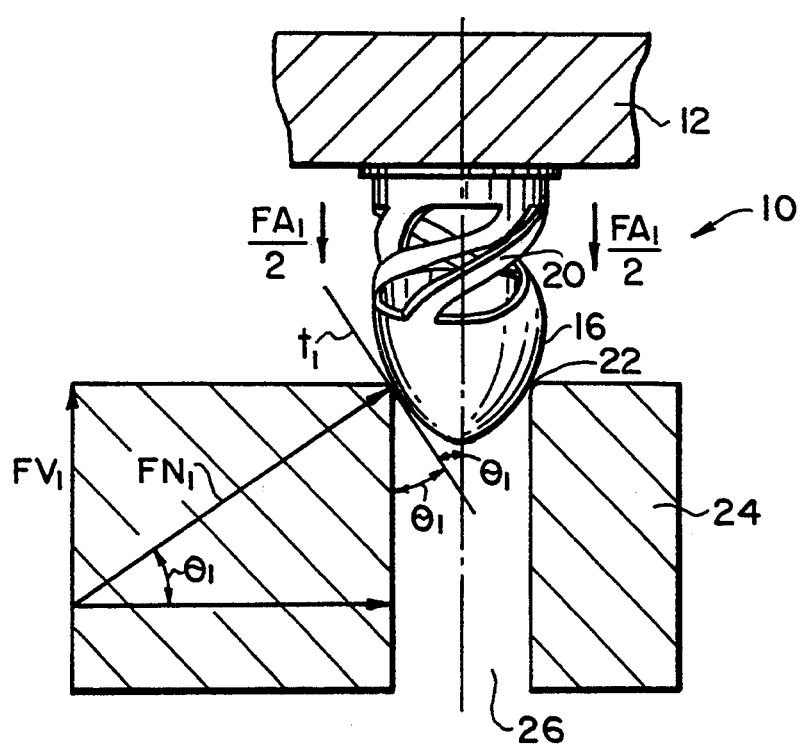

As seen in the Figures described above, the preferred embodiment of the contact element 10 includes a tapered contact portion 16 which has a non-linear taper. In other words, the contact portion is preferably hemispherical, paraboloidal or the like. The reason for providing the contact portion with a non-linear taper is to assure that adjacent contacts will generate similar normal forces aginst adjacent rims, even if the adjacent rims have slightly non-uniform diameters. In particular, it will be appreciated that the axial force exerted on the contact portion by the spring is translated to a normal force acting between the the contact portion and the conductive rim of the hole. FIGS. 5a and 5b show in simplified two dimensional form how the normal force varies with a non-linearly tapered contact portion. As exemplified in FIGS. 5a and 5b, the normal force vector FN is the force perpendicular to the tangent t of the contact portion 16 at the point where the contact portion 16 contacts rim 22. Thus, as shown in FIG. 5a, where the contact portion 16 only enters a small part of hole 26, a tangent line $t_1$ drawn from the point of contact between rim 22 and contact portion 16 forms an angle $\Theta_1$ with the vertical of 30° for example. The normal force $FN_1$ between the contact portion and the rim is therefore equal to the vertical force $FV_1$ divided by the sine of 30° (i.e., $2FV_1$). In the simplified two dimensional example of FIG. 5a, and by way of example only, if the axial force $FA_1$ exerted by spring 20 is 0.5 newtons, the vertical force $FV_1$ on either side of the contact portion acting on the rim is 0.25 newtons ($FA_1/2$). The resulting normal force $FN_2$ between the rim and the contact portion is 0.5 newtons on each side for a total of 1.0 nt acting in a normal fashion between the contact portion and the rim.

Comparatively, in FIG. 5b, where the hole 26 of the circuit board has a wider diameter, the force exerted by spring 20 is less because the contact portion 16 extends farther into wider diameter hole 26 and the spring is therefore less biased. However, when the contact portion extends deeper into the hole, the tangent line $t_2$ drawn from the point of contact between the contact portion and rim has an angle $\Theta_2$ with the vertical of 15° for example. The normal force between the contact portion and the rim $FN_2$ is therefore equal to the vertical force $FV_2$ divided by the sine of 15° (i.e., approximately $4FV_2$). In the simplified two dimensional example of FIG. 5b, if the axial force exerted by spring 20 is only 0.25 newtons because of a smaller spring compression, the vertical force $FV_2$ on either side of the contact portion acting on the rim is 0.125 newtons ($FA_2/2$). The resulting normal force $FN_2$ between the rim and the contact portion is 0.5 newtons on each side for a total of 1.0 nt acting normally between the contact portion and the rim. Thus, it will be appreciated that by dimensioning the contact portion with the proper curvature, the normal force between the rim and the contact portion of the contact element is substantially maintained even where the hole is wider and the contact portion of the contact element enters deeper into the hole. In other words, the magnification of forces due to the shape of non-linear shape of the contact portion offsets changes in the spring force due to more or less compression.

Figure 6:
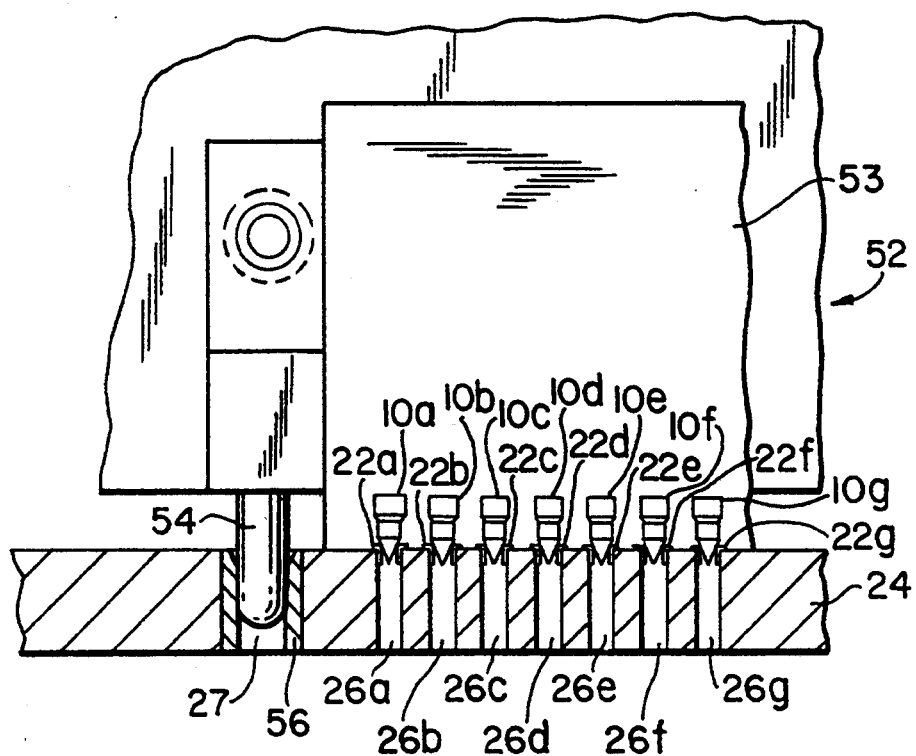
FIG. 6 is a partial cross section showing several contact elements used to connect a daughter PCB to a mother PCB.

As mentioned above, the contact elements of the invention can be used to connect one circuit board to another. FIG. 6 shows one example of how the contact elements of the invention can be used to mate a mother and a right angle daughter board. In FIG. 6, a section of a daughter board 52 is shown mounted perpendicular to a mother board 24. The daughter board 52 is provided with a connector 53 having a plurality of contact elements, for example 10a–10g which are arranged in any manner consistent with accepted industry practices. In particular, however, contact elements 10a–10g are arranged in a pattern which will mate with a pattern of holes 26a–26g in the mother board 24. As with the above described embodiments, contact elements 10a–10g electrically couple with conductive rims 22a–22g of the holes 26a–26g on the mother board 24. In addition, in order to align the contact elements with the conductive rim, a guide hole 27 is preferably provided in the mother board 24, and the connector 53 preferably is correspondingly provided with a guide pin 54. The guide pin 54 enters guide hole 27, and if desired, the pin 54 may be conductive and form part of the electrical connection between the boards, and may provide a "first make" arrangement. In this case, the guide hole 27 is advantageously provided with a conductive lining 56 which couples to other circuitry on the mother board in any known manner. It will be appreciated that several different means for fastening the mother and daughter boards together are described in the above-referenced parent applications.

Figure 7A:
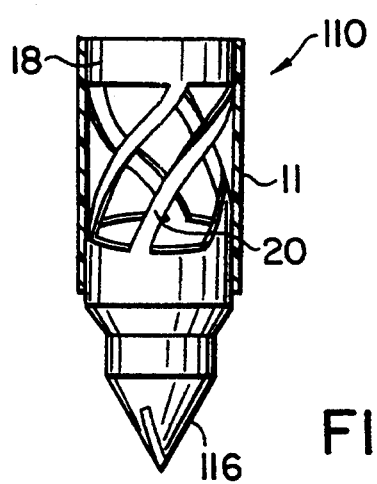
FIGS. 7a and 7b are perspective views of a contact element mounted within a guiding cylinder, where the contact element of FIG. 7b is in compression.
Figure 7B:
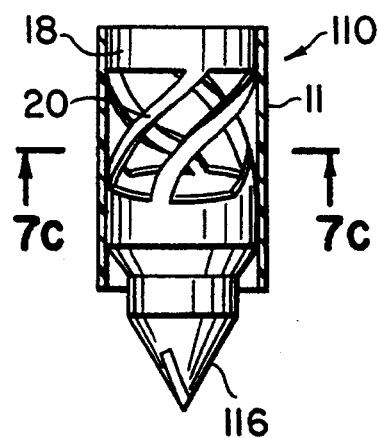
Figure 7C:
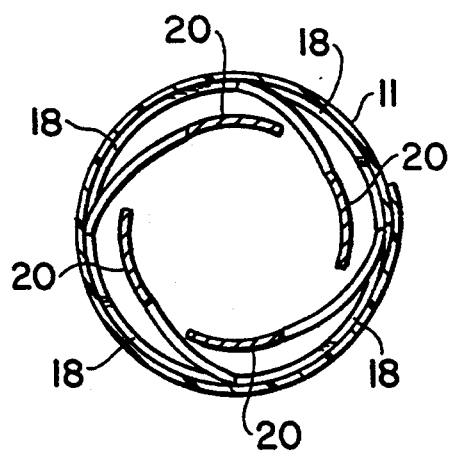
FIG. 7c is a view taken at arrows 7c-7c of FIG. 7b.

FIGS. 7a and 7b show another embodiment of the invention. As mentioned above with reference to FIGS. 3a–3d, if the contact elements are formed from flat stock, they may be joined at cut edges to provide a substantially cylindrical arrangement. In the embodiment of FIGS. 7a and 7b, in creating contact element 110, the stamped or etched blank is rolled and surrounded by a cylindrical collar 11, and as seen in FIG. 7c, not necessarily closed. Indeed, the rolled contact element 110 may overlap (as seen in FIG. 7c), abut at cut edges, or even fail to form a complete cylinder, provided the base portion is adequately supported by the collar. Regardless, the collar 11 of FIGS. 7a and 7b is preferably dimensioned so that substantially all of the spring portion 20 of the contact element is covered by the collar when the contact element is extended to its maximum length as shown in FIG. 7a. Collar 11 and contact portion 116 of the contact element 110 are also dimensioned such that when the spring portion 20 is compressed (i.e. when the contact portion 116 biases a conductive rim of a hole) as shown in FIG. 7b, the contact portion 116 extends sufficiently beyond the collar 11 so that electrical contact is not impeded by the collar. It will be appreciated that the spring portion 20 and contact portion 116 of the contact element 110 must be free to move axially relative to the collar, but that the base portion 18 of the contact element 110 may be mechanically fixed to the collar 11. Alternatively, the collar may be mechanically fixed to the device carrying the contact elements. The collar is preferably non-conductive and may be constructed of plastic sheet material which is cut and rolled. As will be appreciated, a non-conductive collar serves to electrically isolate individual contact elements from each other. As seen in FIGS. 7a and 7b, the contact portion 116 of contact element 110 is a bifurcated conical contact portion unlike the non-linearly tapered contact portions described above. The bifurcation provides some lateral tolerance to the system which might otherwise be limited due to the collar of the embodiments of FIGS. 7a and 7b. It will be appreciated that the partial helical spring concept of the invention can be applied to any type of contact portion whether the contact portion is tapered or not it is, however, preferred that the contact portion be tapered and it is further preferred that it be non-linearly tapered as shown and described above.

Besides providing electrical insulation of the contact element, the collar 11 shown in FIGS. 7a and 7b is useful as acting as a stop for the contact element, thereby limiting the axial compression of the spring. In fact, because the preferred flat spring elements of the invention bend inwardly when compressed (as shown in FIG. 7c), failure to limit the axial compression could result in the spring elements contacting each other. Thus, the collar not only prevents accidental compression beyond the elastic limit of the spring, but also prevents unwanted contact among the spring elements, and resultingly preserves the life of the spring and contact elements.

FIG. 8a shows yet another embodiment of the invention where a contact element 210 couples a pair of PCBs 24, 80 which are parallel to each other. The contact element 210 shown in FIG. 8 is constructed of separate modular components for the contact portion 216, the spring 20a and the base 18a. According to the preferred modular construction of contact element 210, the contact portion 216 and the spring 20a are fixed sizes while the base portion 18a may be made in various sizes. This allows the base to be fashioned to any desired length so that the overall length of the contact element is long enough to span the distance required between two parallel PCBs 24, 80. As shown in FIG. 8a, the base 18a of contact element 210 is surface mounted on PCB 80 in a position which will align with hole 26 in PCB 24 when the boards are coupled. One or more guide pins 82 are provided for aligning the two boards in a manner similar to that described above and in the parent applications. In addition, one or more spacers 84 may be provided to electrically isolate each contact element from the other contact elements. Such spacers may also be desirable to protect components mounted on either board from being sandwiched too tightly between the boards; i.e., to limit the axial movement of the contact elements 210.

Turning to FIG. 8b, a contact element 310 which is a cross between the contact elements of FIGS. 7a and 8a is seen. The contact element 310 is preferably formed from flat stock, punched to form spring elements 320, and rolled and formed to form a contact portion 316 and base 318. Because the "seam" of the base 318 is not welded or otherwise fastened together (although it could be), an alignment jig 384 is provided which acts both to align placement of the contact element 310 on board 80, and to support the base portion 318 and at least part of the spring element portion 320. In particular, as seen in FIG. 8b, the alignment jig 384 has a stepped configuration, with a first recessed portion 384a near PCB 80 which allows room for the soldering of the base 318 to a SMT surface mount pad 81 as indicated by solder joints 83. The supporting portion 384b of alignment jig 384 effectively provides a supporting collar (as discussed above with reference to FIGS. 7a and 7b). The supporting portion 384b supports a portion of the base 318 and a portion of the spring portion 320 of the contact element, such that the contact element 310 need not be fastened to form a cylinder. As shown, the supporting portion 384b does not extend all of the way up to the contact portion 316 of the contact element 310. Rather, a second recessed portion 384c is provided which acts to provide a stop while still providing the contact element 310 adequate lateral flexibility (shown in phantom at the tip of the contact element) as it mates with the conductive rim 22 of PCB 24 similar to the embodiment of the contact element of FIG. 8a.

Turning to FIG. 9, another modular contact element 410 similar to contact element 210 of FIG. 8a is seen, but the contact element 410 is constructed of five sections: contact portion 216; first spring 20a; bridge 21; second spring 20b; and base 18b. In this embodiment, it should be noted that the springs 20a, 20b are mounted with their turns opposite each other so that the compression of the contact element 410 effects only a limited rotation of the contact portion 216. The length, element thickness, helicicity, etc. of the spring 20b may be chosen as desired to control the parameters of the contact element 410 such as the torque, axial spring rate, etc. Thus, by adding the additional spring 20b, the contact element 410 is provided with an additional degree of freedom. For example, a desired amount of the rotation generated by the helical springs 20a may be absorbed by the oppositely wound springs 20b. Such an arrangement might be useful when the contact elements of the invention are used to couple with conductive rims made of a soft metal such as gold and repeated connection and disconnection is anticipated, as a very strong wiping rotation of the contact portion might tend to wear excessively against the soft metal rim. It is noted that the contact element 310 may be stamped or etched from flat stock as described with reference to FIGS. 3c and 3d, or otherwise formed as desired.

It will be appreciated that many variations to the contact element 410 of FIG. 9 may be provided. Rather than having the spring arranged with turns opposite each other, it may be desirable to have the turns arranged in the same direction. Such an arrangement might provide yet additional torque to the system without compromising the integrity of the spring elements. Further, it will be appreciated that more than two spring portions could be arranged in tandem as desired.

There have been described and illustrated herein several embodiments of a spring biased contact elements which provide rotational wipe (torque) when mating and are useful in electrical connectors and in conjunction with integrated circuits. While particular embodiments of the invention have been described, it is not intended that the invention be limited thereto, as it is intended that the invention be as broad in scope as the art will allow and that the specification be read likewise. Thus, while particular partially helical springs have been disclosed, it will be appreciated that other kinds of springs could be utilized. Also, while certain tapered contact portions have been shown, it will be recognized that other types of contact portions such as disclosed in the parent applications hereto could be used with similar results obtained. Moreover, while particular materials and dimensions have been disclosed, it will be appreciated that other materials and dimensions could be used as well. In addition, while it is generally preferred that the contact elements be entirely conductive, it may be advantageous to make part of the contact element non-conductive. For example, while the conductive contact portion must be electrically coupled to the device carrying the contact element, the spring portion could be non-conductive provided that the contact portion is electrically coupled to the carrying member by a flexible wire or the like. Further, it will be appreciated that aspects of the the described embodiments can be mixed and matched with other aspects of other described embodiments. It will therefore be appreciated by those skilled in the art that yet other modifications could be made to the provided invention without deviating from its spirit and scope as so claimed.

I claim:

1. A contact element for an electrical connector which provides an electrical connection between a first object and a conductive rim of a hole of a second object, said electrical connector for use with a fastening means for fastening said electrical connector and said second object, said contact element comprising:
    a) a conductive tapered contact portion which contacts said conductive rim, said contact portion electrically coupled to said first object;
    b) a spring portion mechanically coupled to said contact portion and said first object, said spring portion constructed and coupled such that compression of said spring portion effects a torsional rotation of said contact portion.

2. A contact element according to claim 1, wherein: said tapered contact portion has a non-linear taper.

3. A contact element according to claim 1, wherein:

said spring portion includes at least one at least partially substantially helical spring element.

4. A contact element according to claim 3, wherein:
said spring portion includes at least three at least partially substantially helical spring elements.

5. A contact element according to claim 3, wherein:
said at least partially substantially helical spring element has a cross-section shape which is other than round.

6. A contact element according to claim 1, wherein:
said spring portion is electrically conductive and electrically couples said contact portion to said first object.

7. A contact element according to claim 6, wherein:
said spring portion and said contact portion are constructed as an integral piece.

8. A contact element according to claim 1, further comprising:
c) a base portion which mechanically couples said spring portion to said first object.

9. A contact element according to claim 8, wherein:
said base portion and said spring portion are constructed from a single piece of conductive material.

10. A contact element according to claim 9, wherein:
said contact portion is also formed from said single piece of conductive material.

11. A contact element according to claim 10, wherein:
said piece of conductive material is a substantially flat sheet which is cut and rolled to form said contact element.

12. A contact element according to claim 1, further comprising:
c) a guiding collar in the form of a cylinder, said contact element extending at least partially within said guiding collar.

13. A contact element according to claim 12, wherein:
said guiding collar is non-conductive.

14. A contact element according to claim 8, wherein:
at least two of said spring portion, said base portion, and said contact portion are formed as separate pieces and subsequently coupled together to form said connector element.

15. A contact element according to claim 1, further comprising:
c) a bridge portion coupled to said spring portion, wherein said spring portion is a first spring portion;
d) a second spring portion coupled to said bridge portion; and
e) a base portion for mechanically coupling said second spring portion to said first object, wherein
said bridge portion, said second spring portion and said base portion mechanically couple said first spring portion to said first object.

16. A contact element according to claim 15, wherein:
said second spring portion is constructed and coupled to said base portion such that compression of said second spring portion effects a torsional rotation of said contact portion in a manner opposite to compression of said first spring portion, and
said first spring portion is a first at least partially helical spring, and said second spring portion is a second at least partially helical spring.

17. An electrical connector for mating with conductive rims of holes of a circuit board, comprising:

a) a plurality of contact element means, each contact element means having a conductive tapered contact portion which contacts a respective said conductive rim, and a spring portion coupled to said contact portion, said spring portion constructed and coupled such that compression of said spring portion effects a torsional rotation of said contact portion; and
b) fastening means for use in fastening said electrical connector to said circuit board to keep said plurality of tapered contact portions mated with said conductive rims.

18. An electrical connector according to claim 17, further comprising:
c) a dielectric housing for housing said plurality of contact element means and insulating said plurality of contact element means one from another.

19. An electrical connector according to claim 18, wherein:
each said tapered contact portion has a non-linear taper.

20. An electrical connector according to claim 18, wherein:
said spring portion has a plurality of at least partially substantially helical spring elements.

21. An electrical connector according to claim 18, wherein:
each said contact element means further comprises a base portion coupled to said spring portion.

22. An electrical connector according to claim 21, wherein:
at least two of said base portion, said spring portion, and said tapered contact portion are constructed from a single piece of conductive material.

23. An electrical connector according to claim 22, wherein:
said piece of conductive material is a flat sheet which is cut and rolled to form said contact element.

24. An electrical connector according to claim 18, wherein:
said spring portion comprises at least one at least partially substantially helical spring element having a cross-section shape which is other than round.

25. An electrical connector according to claim 18, wherein:
each of said plurality of contact element means further comprises a bridge portion coupled to said spring portion, wherein said spring portion is a first spring portion, a second spring portion coupled to said bridge portion, and a base portion.

26. An electrical connector according to claim 25, wherein:
said second spring portion is constructed and coupled to said base portion such that compression of said second spring portion effects a torsional rotation of said contact portion in a manner opposite to compression of said first spring portion.

27. An electrical connector according to claim 25, wherein:
said first spring portion has a plurality of first a least partially substantially helical spring elements, and said second spring portion has a plurality of second at least partially substantially helical spring elements.

28. An electrical connector according to claim 18, wherein:
said dielectric housing has a collar portion in contact with said plurality of contact element means at portions of said contact element means other than said conductive tapered contact portions of said contact element means.

29. An integrated circuit package for use with a fastening means for fastening said integrated circuit package to a circuit device, said integrated circuit package comprising:
   a) an integrated circuit; and
   b) a plurality of conductive lead elements electrically and mechanically coupled to said integrated circuit, each of said lead elements comprising a conductive tapered contact portion which contacts a conductive rim of said circuit device, and a spring portion coupled to said contact portion, said spring portion constructed and coupled such that compression of said spring portion upon mating of said conductive tapered contact portions in said conductive rims of said circuit device effects a torsional rotation of said contact portion.

30. An integrated circuit package according to claim 29, wherein:
   each said spring portion includes at least one at least partially substantially helical spring element.

31. An integrated circuit package according to claim 30, wherein:
   each said spring portion includes at least three at least partially substantially helical spring elements.

32. An integrated circuit package according to claim 31, wherein:
   each said at least partially substantially helical spring element has a cross-section shape which is other than round.

33. An integrated circuit package according to claim 29, wherein:
   said spring portion and said contact portion of each said conductive lead element are constructed as an integral piece.

34. An integrated circuit package according to claim 29, wherein:
   each said conductive lead element includes a base portion coupled to said spring portion.

35. An integrated circuit package according to claim 34, wherein:
   said base portion and said spring portion are constructed from a single piece of conductive material.

36. An integrated circuit package according to claim 35, wherein:
   said contact portion is also formed from said single piece of conductive material.

37. An integrated circuit package according to claim 36, wherein:
   said piece of conductive material is a substantially flat sheet which is cut and rolled to form said contact element.

38. An integrated circuit package according to claim 29, further comprising:
   c) a plurality of guiding collars in the form of cylinders, with respective of said plurality of conductive lead elements extending at least partially within respective of said guiding collars.

39. An integrated circuit package according to claim 38, wherein:
   said plurality of guiding collars are non-conductive.

40. An integrated circuit package according to claim 34, wherein:
   at least two of said spring portion, said base portion, and said contact portion of a said conductive lead element are formed as separate pieces and subsequently coupled together to form said conductive lead element.

41. An integrated circuit package according to claim 29, further comprising:
   c) a housing for said integrated circuit, said housing having a bottom surface, wherein said plurality of lead elements are mounted substantially perpendicular to said bottom surface of said housing and within a periphery defined by said bottom surface of said housing.

42. An integrated circuit package according to claim 29, wherein:
   said plurality of lead elements each include a bridge portion coupled to said spring portion, wherein said spring portion is a first spring portion, a second spring portion coupled to said bridge portion, and a base portion coupled to said second spring portion.

43. An integrated circuit package according to claim 42, wherein:
   said second spring portion is constructed and coupled to said base portion such that compression of said second spring portion effects a torsional rotation of said contact portion in a manner opposite to compression of said first spring portion.

44. An integrated circuit package according to claim 42, wherein:
   said first spring portion is a first at least partially helical spring, and said second spring portion is a second at least partially helical spring.

45. An integrated circuit package according to claim 29 in conjunction with an alignment jig, wherein:
   said alignment jig comprises a dielectric housing having a plurality of collar portions, each collar portion in contact with a respective conductive lead element at a portion of said conductive lead element other than said conductive tapered contact portion of said conductive lead element.

46. An integrated circuit package for use with a fastening means for fastening said integrated circuit package to a circuit device having a plurality of holes with conductive rims for solderless connection to said circuit device, said integrated circuit package comprising:
   a) an integrated circuit; and
   b) a plurality of conductive lead elements electrically and mechanically coupled to said integrated circuit, each of said lead elements comprising a conductive tapered contact portion which contacts a respective one of the conductive rims of the circuit device, and a spring portion coupled to said contact portion and biasing said contact portion against the respective one of the conductive rims when the fastening means fastens said integrated circuit package to the circuit device.

* * * * *